United States Patent
Liou et al.

(10) Patent No.: US 11,482,517 B2
(45) Date of Patent: Oct. 25, 2022

(54) INTEGRATED CIRCUIT

(71) Applicant: UNITED MICROELECTRONICS CORP., Hsin-Chu (TW)

(72) Inventors: En-Chiuan Liou, Tainan (TW); Chih-Wei Yang, Tainan (TW); Kuei-Chun Hung, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 588 days.

(21) Appl. No.: 15/980,759

(22) Filed: May 16, 2018

(65) Prior Publication Data

US 2018/0261589 A1 Sep. 13, 2018

Related U.S. Application Data

(62) Division of application No. 14/945,443, filed on Nov. 19, 2015.

(30) Foreign Application Priority Data

Oct. 22, 2015 (TW) ................................ 104134747

(51) Int. Cl.
*H01L 27/02* (2006.01)
*H01L 21/3213* (2006.01)
*H01L 27/11582* (2017.01)
*H01L 49/02* (2006.01)

(52) U.S. Cl.
CPC .... *H01L 27/0207* (2013.01); *H01L 21/32139* (2013.01); *H01L 27/11582* (2013.01); *H01L 28/00* (2013.01)

(58) Field of Classification Search
None
See application file for complete search history.

(56) References Cited

U.S. PATENT DOCUMENTS

| | | | | | |
|---|---|---|---|---|---|
| 5,306,585 | A | * | 4/1994 | Okamoto | G03F 1/30 430/22 |
| 5,308,741 | A | * | 5/1994 | Kemp | G03F 1/26 428/156 |
| 5,403,682 | A | * | 4/1995 | Lin | G03F 1/29 430/320 |
| 5,411,823 | A | * | 5/1995 | Okamoto | G03F 1/29 430/5 |
| RE35,315 | E | * | 8/1996 | Okamoto | G03F 1/29 378/34 |

(Continued)

*Primary Examiner* — Erik T. K. Peterson
(74) *Attorney, Agent, or Firm* — Winston Hsu

(57) ABSTRACT

An integrated circuit process includes the following steps. A substrate including a first area and a second area is provided. A plurality of line patterns cover the substrate of the first area, and a sacrificial line pattern covers the substrate of the second area, wherein these line patterns separate from and are orthogonal to the sacrificial line pattern. The present invention also provides an integrated circuit formed by said process. A substrate includes a first area and a second area; a plurality of line patterns cover the substrate of the first area; a slot pattern is in the substrate of the second area, wherein these line patterns are orthogonal to the slot pattern. Additionally, a plurality of line patterns cover the substrate; a sacrificial line pattern is at ends of the line patterns, wherein these line patterns separate from and are orthogonal to the sacrificial line pattern.

5 Claims, 5 Drawing Sheets

(56) References Cited

U.S. PATENT DOCUMENTS

| | | | |
|---|---|---|---|
| 5,955,222 A * | 9/1999 | Hibbs | G03F 1/29 430/5 |
| 6,287,904 B1 | 9/2001 | Lee | |
| 6,436,611 B1 * | 8/2002 | Lee | H01L 21/76229 257/E21.548 |
| 6,448,630 B1 * | 9/2002 | Komori | H01L 21/31053 257/405 |
| 6,492,073 B1 | 12/2002 | Lin | |
| 6,582,856 B1 * | 6/2003 | Quek | G03F 1/29 430/323 |
| 6,605,394 B2 * | 8/2003 | Montgomery | G03F 1/46 430/296 |
| 6,620,557 B1 * | 9/2003 | Hosono | G03F 7/70616 430/5 |
| 7,598,174 B1 | 10/2009 | Zhuang | |
| 7,939,384 B2 | 5/2011 | Chuang | |
| 8,298,943 B1 | 10/2012 | Arnold | |
| 8,765,610 B2 * | 7/2014 | Shini | H01L 21/0337 438/703 |
| 2002/0194576 A1 * | 12/2002 | Toyama | G03F 1/36 716/52 |
| 2003/0148549 A1 | 8/2003 | Hasegawa | |
| 2003/0152844 A1 * | 8/2003 | Dulman | G03F 1/30 430/5 |
| 2003/0230234 A1 | 12/2003 | Nam | |
| 2004/0038135 A1 * | 2/2004 | Griesinger | G03F 7/70441 430/5 |
| 2004/0185637 A1 * | 9/2004 | Fu | H01L 23/544 438/401 |
| 2005/0255389 A1 * | 11/2005 | Tange | G03F 1/29 430/5 |
| 2005/0286052 A1 * | 12/2005 | Huggins | G03F 9/7076 356/401 |
| 2006/0131576 A1 | 6/2006 | Koh | |
| 2006/0211280 A1 * | 9/2006 | Igarashi | G01R 1/0735 439/91 |
| 2006/0286754 A1 * | 12/2006 | Hosomi | H01L 27/0203 438/297 |
| 2007/0105334 A1 * | 5/2007 | Jang | H01L 27/105 438/396 |
| 2007/0210449 A1 | 9/2007 | Caspary | |
| 2007/0275309 A1 * | 11/2007 | Liu | G03F 7/70466 430/5 |
| 2007/0290232 A1 * | 12/2007 | Nishiyama | H01L 27/105 257/202 |
| 2008/0001233 A1 * | 1/2008 | Kapoor | H01L 27/0207 257/369 |
| 2008/0113483 A1 * | 5/2008 | Wells | H01L 27/0207 438/424 |
| 2008/0119048 A1 * | 5/2008 | Sarma | G03F 1/50 438/689 |
| 2008/0160422 A1 * | 7/2008 | Chen | G03F 1/30 430/5 |
| 2008/0166856 A1 * | 7/2008 | Parekh | H01L 27/10876 438/435 |
| 2009/0075485 A1 | 3/2009 | Ban | |
| 2009/0087959 A1 | 4/2009 | Ban | |
| 2009/0142932 A1 | 6/2009 | Jung | |
| 2009/0200583 A1 | 8/2009 | Marokkey | |
| 2009/0225331 A1 * | 9/2009 | Van Haren | G03F 7/70633 356/614 |
| 2010/0096719 A1 * | 4/2010 | Lee | H01L 21/0332 257/506 |
| 2010/0221919 A1 | 9/2010 | Lee | |
| 2010/0297563 A1 * | 11/2010 | Watanabe | G03F 7/0035 430/325 |
| 2010/0297852 A1 | 11/2010 | Jung | |
| 2011/0062595 A1 | 3/2011 | Sim | |
| 2011/0124194 A1 | 5/2011 | Kwon | |
| 2011/0207330 A1 | 8/2011 | Ohuchi | |
| 2012/0074400 A1 | 3/2012 | Shieh | |
| 2012/0083126 A1 | 4/2012 | Lee | |
| 2012/0168841 A1 * | 7/2012 | Chen | H01L 21/0337 257/314 |
| 2012/0171865 A1 * | 7/2012 | Yoo | G03F 1/38 438/694 |
| 2012/0243358 A1 * | 9/2012 | Sugimae | H01L 27/11524 365/205 |
| 2012/0302059 A1 * | 11/2012 | Aton | H01L 21/32139 438/669 |
| 2012/0331425 A1 | 12/2012 | Blatchford | |
| 2013/0087527 A1 * | 4/2013 | Pain | B82Y 10/00 216/18 |
| 2013/0161839 A1 * | 6/2013 | Han | H01L 21/0337 257/786 |
| 2013/0237050 A1 * | 9/2013 | Kikutani | H01L 27/11519 438/618 |
| 2013/0270716 A1 * | 10/2013 | Kim | H01L 23/522 257/775 |
| 2013/0277720 A1 * | 10/2013 | Kim | H01L 29/785 257/288 |
| 2013/0277823 A1 | 10/2013 | Ogisu | |
| 2014/0003114 A1 * | 1/2014 | Pellizzer | H01L 27/2481 365/63 |
| 2014/0042588 A1 * | 2/2014 | Kim | H01L 29/0649 257/522 |
| 2014/0083972 A1 | 3/2014 | Oyama | |
| 2014/0273442 A1 | 9/2014 | Liu | |
| 2016/0056234 A1 * | 2/2016 | Cheng | H01L 29/0649 327/535 |
| 2017/0011952 A1 * | 1/2017 | Saito | H01L 21/761 |

* cited by examiner

INTEGRATED CIRCUIT

CROSS REFERENCE TO RELATED APPLICATIONS

This application is a divisional application of and claims the benefit of U.S. patent application Ser. No. 14/945,443, filed Nov. 19, 2015.

BACKGROUND OF THE INVENTION

1. Field of the Invention

The present invention relates generally to an integrated circuit and a process thereof, and more specifically to an integrated circuit and a process thereof that applies orthogonal sacrificial line patterns.

2. Description of the Prior Art

For containing as many semiconductor components in a chip area as possible and for reducing process costs, various semiconductor methods are presented to shrink components' sizes and increase components' density in a chip. In one aspect, operating speed can be fastened as components' sizes shrink; in another aspect, energy costs while operating can be reduced as components' sizes shrink. Thus, it becomes an important issue in current industry to shrink integrated circuit layouts. In integrated circuit processes, field effect transistors are extremely important electronic devices. The processing steps of the field effect transistors are improved to get small volume and high quality transistors as components' sizes shrink.

Ideal critical dimensions (CD) of photoresist layers used for forming integrated circuit layouts including transistors are hard to maintain as components' sizes shrink due to many factors such as the non-uniformity while coating the photoresist layers, pattern collapse and decreasing critical dimensions (CD). Thus, a new solution for overcoming said problems is required in the industry.

SUMMARY OF THE INVENTION

The present invention provides an integrated circuit and a process thereof, that forms sacrificial line patterns orthogonal to and separate from ends of line patterns to improve photoresist uniformity, enhance density of line patterns and end profiles of the line patterns.

The present invention provides an integrated circuit process including the following steps. A substrate including a first area and a second area is provided. A plurality of line patterns are formed to cover the substrate of the first area, and a sacrificial line pattern is formed to cover the substrate of the second area, wherein the line patterns separate from the sacrificial line pattern, and the line patterns are orthogonal to the sacrificial line pattern.

The present invention provides an integrated circuit including a substrate, a plurality of line patterns and a slot pattern. The substrate includes a first area and a second area. The line patterns cover the substrate of the first area. The slot pattern is located in the substrate of the second area, wherein the line patterns are orthogonal to the slot pattern.

The present invention provides an integrated circuit including a substrate, a plurality of line patterns and a sacrificial line pattern. The line patterns cover the substrate. The sacrificial line pattern is located at ends of the line patterns, wherein the line patterns are orthogonal to and separate from the sacrificial line pattern.

According to the above, the present invention provides an integrated circuit and a process thereof, which forms a plurality of line patterns covering a substrate of a first area and a sacrificial line pattern covering a substrate of a second area. The sacrificial line pattern is orthogonal to and separates from ends of the line patterns. In this way, the density of the line patterns approaching processing limitation is increased. Liquid coating materials such as photoresists are prevented from over-flowing into other areas, thereby enhancing photoresist uniformity and improving profiles of ends of the line patterns.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
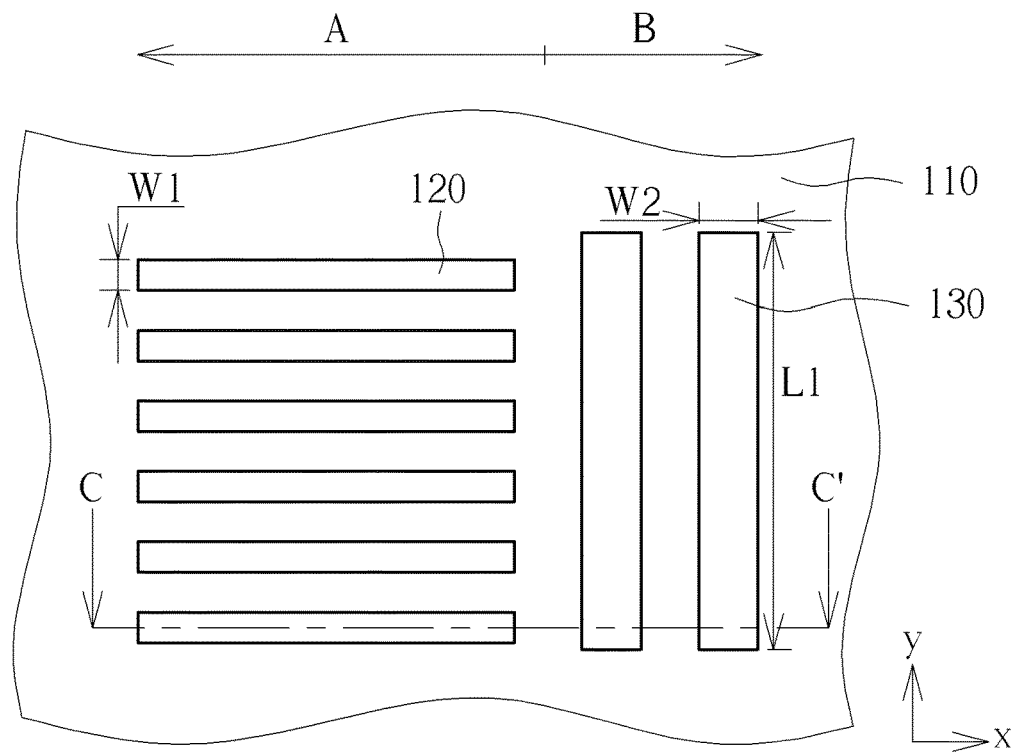
FIG. 1 schematically depicts a layout of an integrated circuit process according to one embodiment of the present invention.
Figure 2:
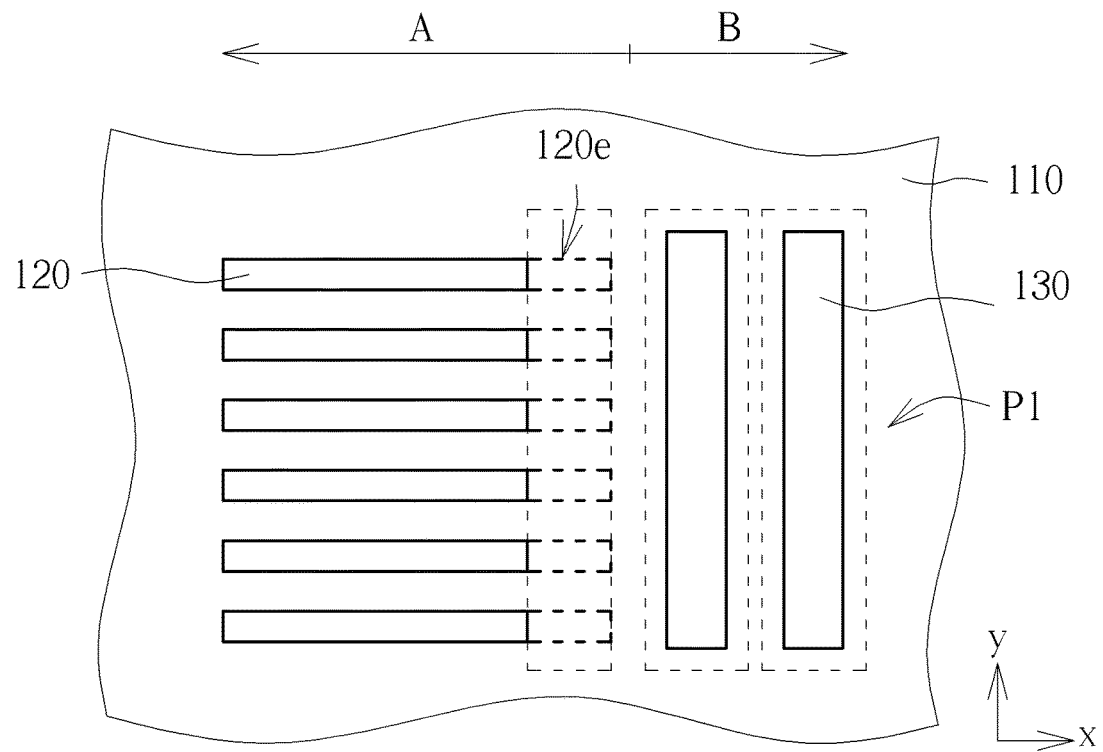
FIG. 2 schematically depicts a layout of an integrated circuit process according to one embodiment of the present invention.
Figure 3:
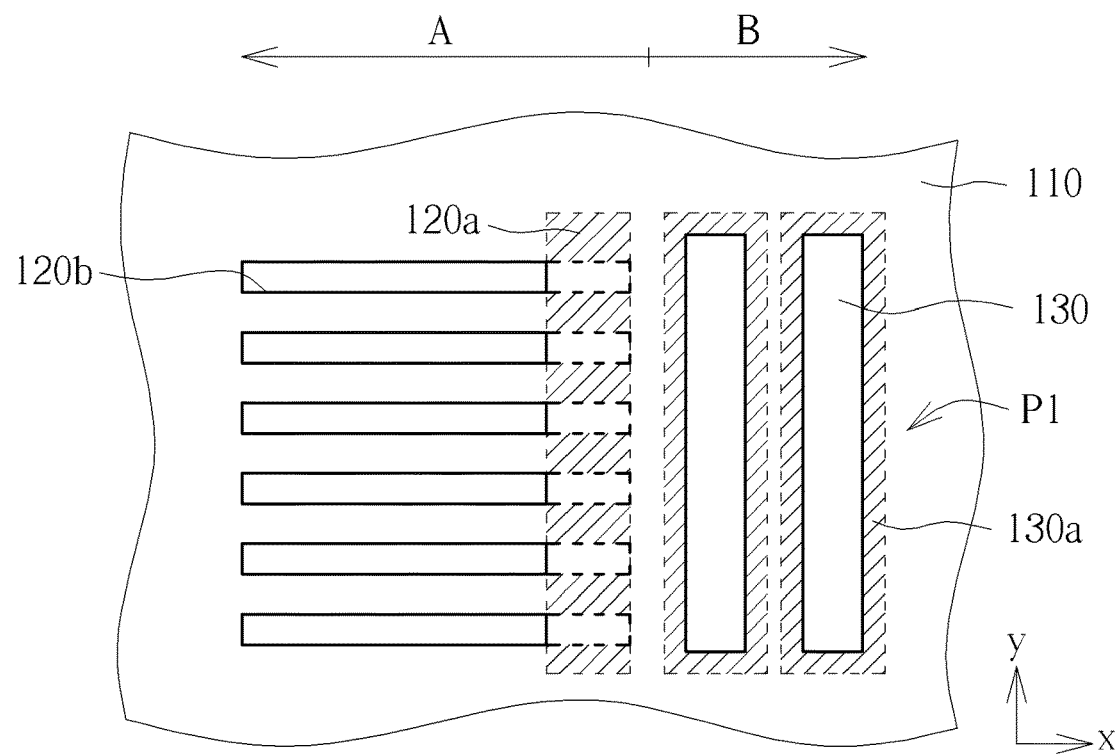
FIG. 3 schematically depicts a layout of an integrated circuit process according to one embodiment of the present invention.

FIGS. 1-3 schematically depict layouts of an integrated circuit process according to one embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. The substrate 110 may include a first area A and a second area B. In this embodiment, the first area A is a dense area while the second area B is an isolated area, thereby the dense area being right next to the isolated area. A plurality of line patterns 120 cover the substrate 110 of the first area A. Two sacrificial line patterns 130 cover the substrate 110 of the second area B. It is emphasized that the line patterns 120 of the present invention must be orthogonal to and separate from the sacrificial line patterns 130. That is, all of the line patterns 120 have one same direction. As the line patterns 120 are all along x-direction, the sacrificial line patterns 130 are along y-direction. Six line patterns 120 and two sacrificial line patterns 130 are depicted in this embodiment, but the number of the line patterns 120 and the sacrificial line patterns 130 is not limited thereto. A length L1 of the sacrificial line patterns 130 preferably correspond to and contain six of the line patterns 120.

The line patterns 120 and the sacrificial line patterns 130 are formed by one same process. For example, single material layer or multi-material layers may cover the substrate 110, and then the material layer or the material layers may be patterned to form the line patterns 120 and the sacrificial line patterns 130 on the substrate 110 at the same time. In this way, the line patterns 120 and the sacrificial line patterns 130 all have common materials, but it is not limited thereto.

Due to process limitations, current lithography and etching processes have a critical dimension (CD) at one direction larger than a critical dimension (CD) at another direction. For instance, due to process limitations, a current lithography and etching process may have a critical dimension (CD) at x-direction less than a critical dimension (CD) at y-direction. Thereby, the line patterns 120 may be along x-direction while the sacrificial line patterns 130 may be along y-direction to increases the density of the line patterns 120. The sacrificial line patterns 130 are located in the isolated area, and can be removed selectively in later processes, thereby the density of sacrificial line patterns 130 less than the density of the line patterns 120 is allowed. Therefore, the sacrificial line patterns 130 have the minimum size larger than the minimum size of the line patterns 120, but it is not limited thereto. In one case, a width w1 of one single line patterns 120 is a critical dimension under exposure limitation, and a width w2 of one single sacrificial line patterns 130 is larger than the critical dimension w1 under exposure limitation.

As shown in FIG. 2, a pattern cutting process P1 is performed to remove end parts 120*e* of the line patterns 120 and the sacrificial line patterns 130. In this embodiment, the sacrificial line patterns 130 are removed completely. In other embodiments, only parts of the sacrificial line patterns 130 are removed. For example, only one of the two sacrificial line patterns 130 is removed. The dashed-line in FIG. 2 is a cutting range of the pattern cutting process P1. The cutting range of the pattern cutting process P1 contains and is larger than the end parts 120*e* of the line patterns 120 and the sacrificial line patterns 130 to ensure removing the end parts 120*e* and the sacrificial line patterns 130 completely. As shown in FIG. 3, slot patterns 120*a*/130*a* (depicted as slashed-line areas) are formed in the substrate 110 surrounding the edges of the end parts 120*e* of the line patterns 120 and the sacrificial line patterns 130 due to etching twice. This means one etching process is performed to pattern the line patterns 120 and the sacrificial line patterns 130, and then the second etching process is performed as the pattern cutting process P1. Therefore, the slot patterns 120*a*/130*a* are formed in the substrate 110 surrounding the edges of the end parts 120*e* of the line patterns 120 and the sacrificial line patterns 130 as the end parts 120*e* of the line patterns 120 and the sacrificial line patterns 130 are removed.

In this embodiment, due to the sacrificial line patterns 130 being in the isolated area, the slot patterns 130*a* are also in the isolated area; due to the sacrificial line patterns 130 having the minimum size larger than the minimum size of the line patterns 120, the slot patterns 130*a* having the minimum size larger than the minimum size of the line patterns 120; due to the line patterns 120 needing to be orthogonal to and separating from the sacrificial line patterns 130, the line patterns 120*b* are all orthogonal to and separate from the slot patterns 130*a*, but it is not limited thereto. In other embodiments, the cutting range of the pattern cutting process P1 may be the whole second area B extending to the end parts 120*e*, depending upon practical requirements. In addition, the cutting range of the pattern cutting process P1 may be a cutting range including at least one of the sacrificial line patterns 130.

Figure 4:
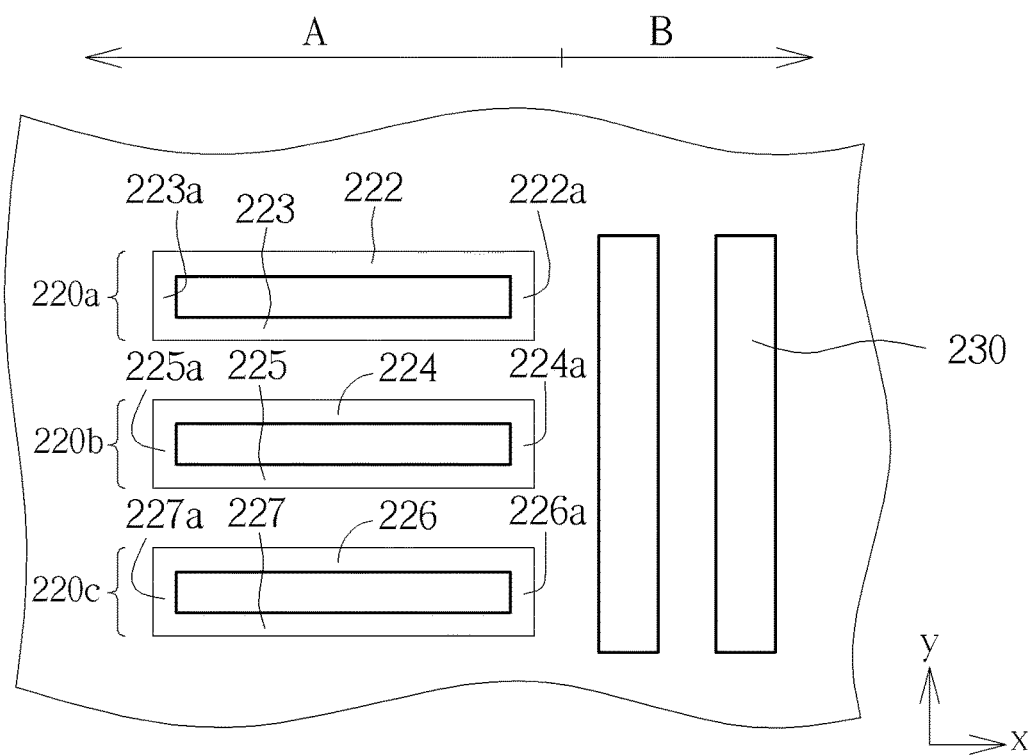
FIG. 4 schematically depicts a layout of an integrated circuit process according to another embodiment of the present invention.
Figure 5:
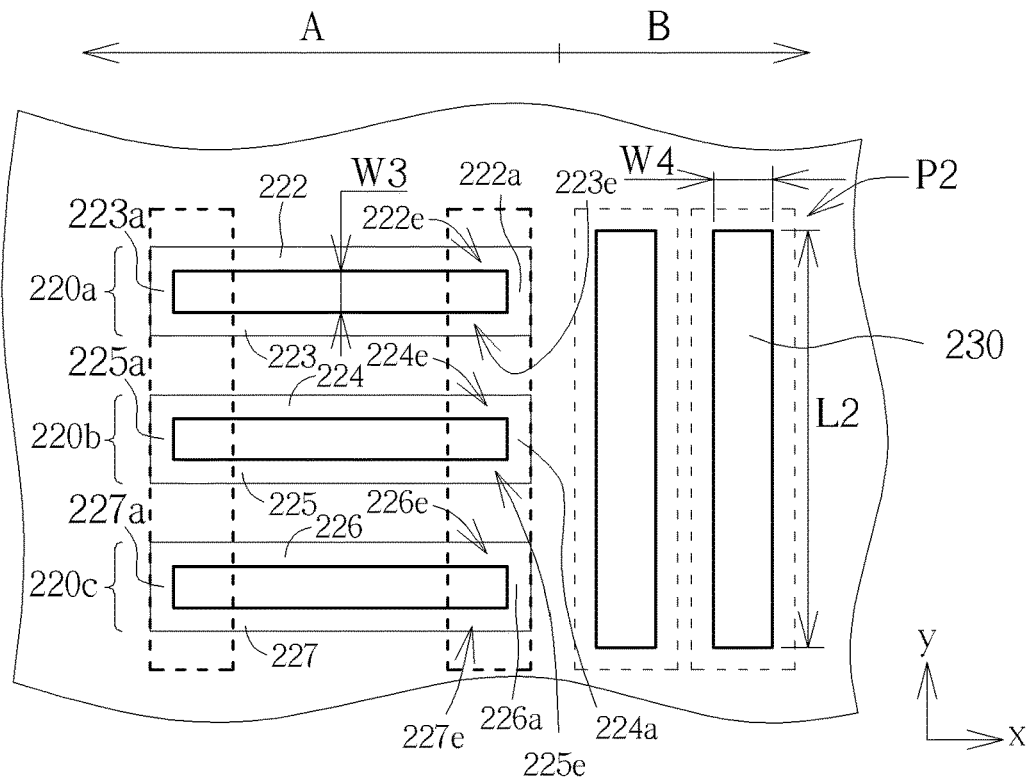
FIG. 5 schematically depicts a layout of an integrated circuit process according to another embodiment of the present invention.

Furthermore, FIGS. 1-3 depict six individual line patterns 120, but it is not limited thereto. The present invention may be applied to a sidewall image transfer (SIT) process, a self-aligned double patterning (SADP) process, or others. FIGS. 4-5 schematically depict layouts of an integrated circuit process according to another embodiment of the present invention. As shown in FIG. 4, two adjacent line patterns 222/223/224/225/226/227 are connected by connecting parts 222*a*/223*a*/224*a*/225*a*/226*a*/227*a*. That is, the line patterns 222/223 are connected by the connecting parts 222*a*/223*a* to constitute a closed pattern 220*a*; the line patterns 224/225 are connected by the connecting parts 224*a*/225*a* to constitute a closed pattern 220*b*; the line patterns 226/227 are connected by the connecting parts 226*a*/227*a* to constitute a closed pattern 220*c*. As shown in FIG. 5, a pattern cutting process P2 is performed to remove end parts 222*e*/223*e*/224*e*/225*e*/226*e*/227*e* of the line patterns 222/223/224/225/226/227 and the sacrificial line patterns 230 completely and to remove the connecting parts 222*a*/223*a*/224*a*/225*a*/226*a*/227*a* completely. The cutting range of the pattern cutting process P2 is depicted as the dashed-lines of FIG. 5, but it is not limited thereto. A length L2 of the sacrificial line patterns 230 preferably corresponds to the three closed patterns 220*a*/220*b*/220*c* at x-direction. In one case, a width w3 of the closed patterns 220*a*/220*b*/220*c* is a critical dimension under exposure limitations (which may be a width of removed sacrificial patterns), and a width w4 of one single sacrificial line patterns 230 is larger than the critical dimension under exposure limitations, but it is not limited thereto.

According to the above, the line patterns 120/222/223/224/225/226/227 of the present invention may include gate patterns, fin patterns, spacer patterns or mask patterns, but it is not restricted thereto. The gate patterns may include polysilicon patterns or amorphous silicon patterns, and the mask patterns may include multilayer patterns, and the multilayer patterns may include nitride/oxide layer patterns or others, depending upon practical requirements.

FIGS. 6-9 schematically depict cross-sectional views of an integrated circuit process according to an embodiment of the present invention. FIGS. 6-9 are cross-sectional views along CC' line of FIGS. 1-3. In this embodiment, the line patterns 120 are gate patterns, but it is not restricted thereto. Please refer to FIGS. 1-3 and FIGS. 6-9.

Figure 6:
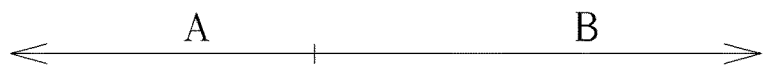
FIG. 6 schematically depicts a cross-sectional view of an integrated circuit process according to an embodiment of the present invention.
Figure 6:
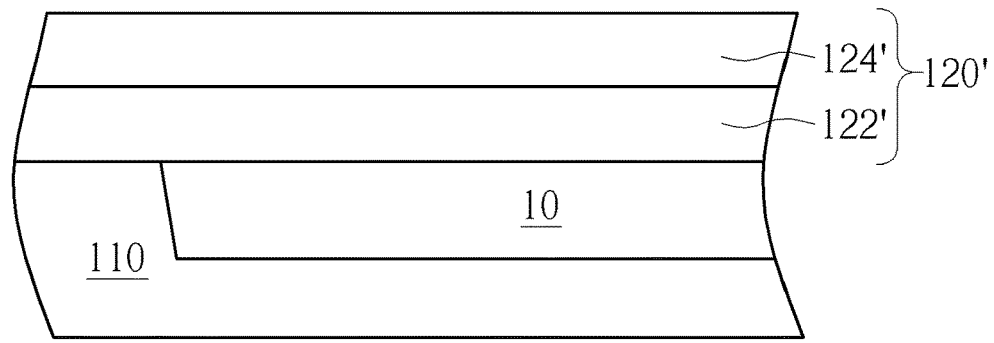

As shown in FIG. 6 along with FIG. 1, the substrate 110 may include an isolation structure 10 located in the second area B, meaning located in the substrate of the isolated area. The isolation structure 10 may be a shallow trench isolation (STI) structure, which may be formed by a shallow trench isolation (STI) process, but it is not limited thereto. A gate layer 120' may blanketly cover the substrate 110, wherein the gate layer 120' includes an electrode layer 122' and a cap layer 124' from bottom to top. In this embodiment, the electrode layer 122' may be a polysilicon layer or an amorphous silicon layer; the cap layer 124' may be a dual layer composed of an oxide layer and a nitride layer from bottom to top, but it is not limited thereto.

Figure 7:
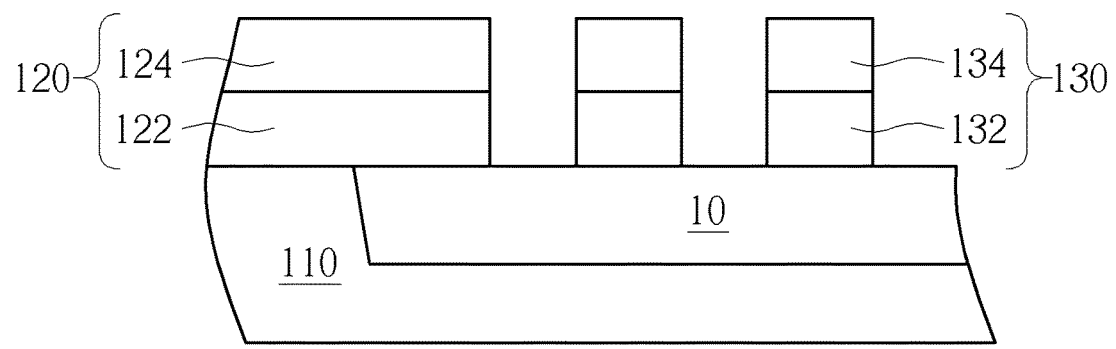
FIG. 7 schematically depicts a cross-sectional view of an integrated circuit process according to an embodiment of the present invention.

A lithography and etching process may be performed to pattern the electrode layer 122' and the cap layer 124' to form a plurality of line patterns 120 including an electrode layer 122 and a cap layer 124, and two sacrificial line patterns 130 including an electrode layer 132 and a cap layer 134 as well, as shown in FIG. 7 along with FIG. 1. In this embodiment, the line patterns 120 and the sacrificial line patterns 130 are formed simultaneously from the gate layer 120' at one same process, thereby the line patterns 120 and the sacrificial line patterns 130 having common materials, but it is not limited thereto. The line patterns 120 must be orthogonal to and separate from the sacrificial line patterns 130. The sacrificial line patterns 130 have a minimum size larger than a minimum size of the line patterns 120.

Figure 8:
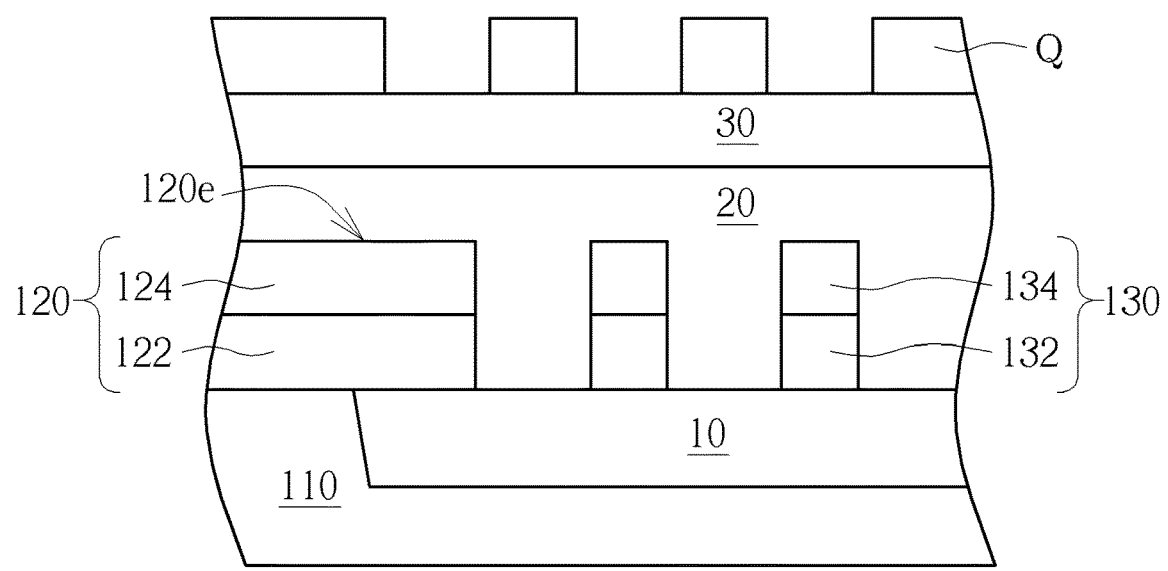
FIG. 8 schematically depicts a cross-sectional view of an integrated circuit process according to an embodiment of the present invention.
Figure 9:
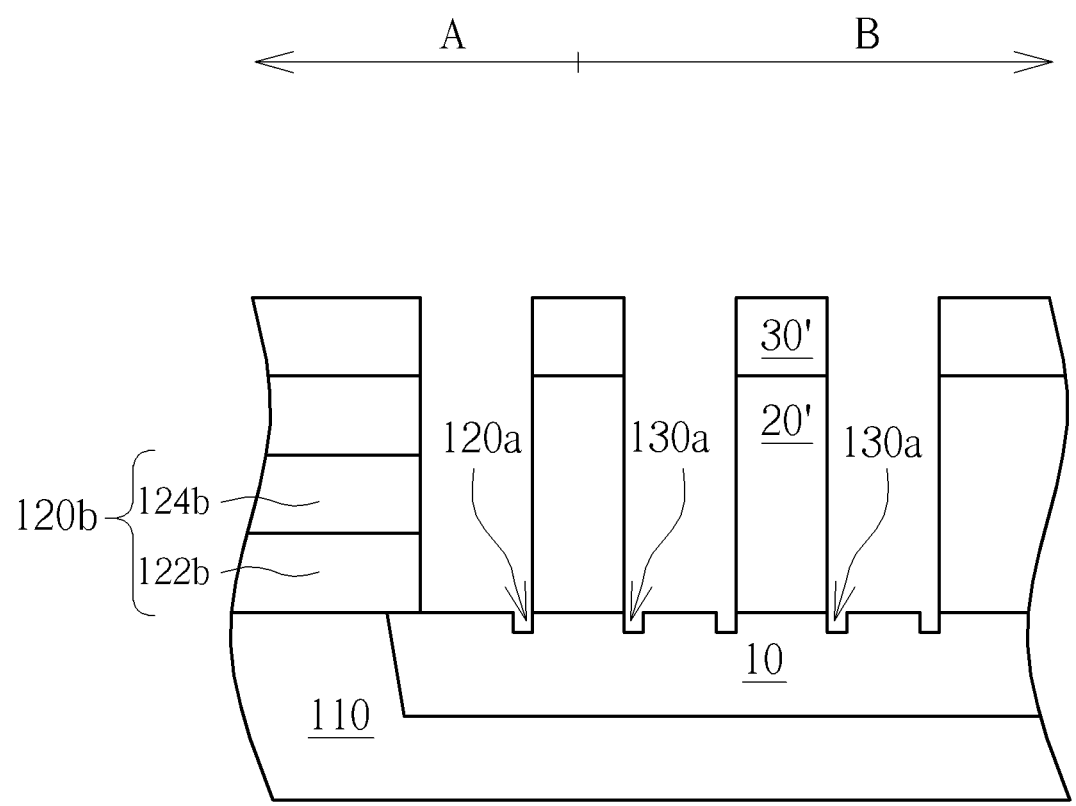
FIG. 9 schematically depicts a cross-sectional view of an integrated circuit process according to an embodiment of the present invention.

As shown in FIGS. 8-9 along with FIGS. 2-3, a pattern cutting process P1 is performed to remove end parts 120e of the line patterns 120 and the sacrificial line patterns 130. More precisely, as shown in FIG. 8, an optical dispersive layer (ODL) 20 and a silicon-containing hard mask bottom anti-reflection coating (SHB) layer 30 may blanketly cover the line patterns 120, the sacrificial line patterns 130 and the substrate 110. In this embodiment, the optical dispersive layer (ODL) 20 and the silicon-containing hard mask bottom anti-reflection coating (SHB) layer 30 may be formed blanketly from bottom to top, but it is not limited thereto. Instead, the optical dispersive layer (ODL) 20 or/and the silicon-containing hard mask bottom anti-reflection coating (SHB) layer 30 may be formed selectively. A photoresist may be coated and patterned to form a patterned photoresist Q on the silicon-containing hard mask bottom anti-reflection coating (SHB) layer 30. It is noted, since the sacrificial line patterns 130 orthogonal to the line patterns 120 have a capability like retaining walls, over-flowing into the second area B (meaning the isolated area in this embodiment) of the optical dispersive layer (ODL) 20, the silicon-containing hard mask bottom anti-reflection coating (SHB) layer 30 and the patterned photoresist Q, which causes thickness non-uniformity and etching non-uniformity of the optical dispersive layer (ODL) 20, the silicon-containing hard mask bottom anti-reflection coating (SHB) layer 30 and the patterned photoresist Q, can be avoided. Thereby, profiles of ends of the line patterns 20 can be improved. Since the sacrificial line patterns 130 have a minimum size larger than a minimum size of the line patterns 120, the present invention can be applied to current lithography and etching processes such as off-axis illumination, which has a critical dimension (CD) at one direction larger than a critical dimension (CD) at another direction, hence increasing the density of the line patterns 120.

The end parts 120e of the line patterns 120 and the sacrificial line patterns 130 may thus be removed by transferring patterns of the patterned photoresist Q, as shown in FIG. 9 along with FIG. 3. More precisely, the patterns of the patterned photoresist Q may be transferred into the optical dispersive layer (ODL) 20 and the silicon-containing hard mask bottom anti-reflection coating (SHB) layer 30, and then the patterns of the optical dispersive layer (ODL) and the silicon-containing hard mask bottom anti-reflection coating (SHB) layer 30 are transferred to remove the end parts 120e of the line patterns 120 and the sacrificial line patterns 130. Therefore, line patterns 120b including an electrode layer 122b and a cap layer 124b and an optical dispersive layer (ODL) 20' and a silicon-containing hard mask bottom anti-reflection coating (SHB) layer 30' remain, but it is not limited thereto. Thereafter, the patterned photoresist Q, the optical dispersive layer (ODL) 20' and the silicon-containing hard mask bottom anti-reflection coating (SHB) layer 30' may be removed. It is noted, as the end parts 120e of the line patterns 120 and the sacrificial line patterns 130 are removed, the edges of the end parts 120e and the sacrificial line patterns 130 are etched twice. Therefore, slot patterns 120a in the substrate 110 and slot pattern 130a in the isolation structure 10 are formed at the edges of the end parts 120e and the sacrificial line patterns 130.

Moreover, the line patterns 120 and the sacrificial line patterns 130 are in the bulk substrate 110 in this embodiment. In addition, the substrate 110 may include a plurality of fin structures in a silicon substrate, and an oxide structure between the fin structures, wherein the line patterns 120 are disposed across the fin structures and on the oxide structure, and the sacrificial line patterns 130 are disposed on the oxide structure, or slot patterns are disposed in the oxide structure, thereby a multi-gate field effect transistor can be formed, depending upon practical requirements.

To summarize, the present invention provides an integrated circuit and a process thereof, which forms a plurality of line patterns covering a substrate of a first area and at least a sacrificial line pattern covering a substrate of a second area. The sacrificial line pattern is orthogonal to and separates from ends of the line patterns. The sacrificial line pattern has a minimum size larger than a minimum size of the line patterns, thereby increasing the density of the line patterns.

A pattern cutting process is performed to remove end parts of the line patterns and the sacrificial line patterns at the same time, wherein the pattern cutting process may include forming and transferring the patterned photoresist and other coating materials. Since the sacrificial line pattern is orthogonal to the line patterns, the uniformity of the photoresist can be enhanced, the profiles of ends of the line patterns can be improved. For instance, as the line patterns are in a dense area while the sacrificial line patterns are in an isolated area, the sacrificial line pattern orthogonal to the line patterns can prevent coating materials such as the photoresist from over-flowing into the isolated area, and thus degrading uniformity can be avoided.

Furthermore, after the pattern cutting process is performed, slot patterns may be formed in the substrate surrounding the end parts of the line patterns and the sacrificial line pattern, thereby constituting a specific structure of the present invention. The line patterns and the sacrificial line pattern can be formed by one same process from common material layers, thus the line patterns and the sacrificial line pattern may have common materials. The line patterns may be gate patterns, fin patterns, spacer patterns or mask patterns, depending upon practical requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit, comprising:
   a substrate comprising a first area and a second area;
   a plurality of line patterns covering the substrate in the first area;
   an end part connecting with one end of each of the line patterns;
   first slot patterns having frame shaped recesses located in the substrate in the second area, and each of the frame shaped recesses surrounding a rectangular protruding part of the substrate, wherein the line patterns and the end parts are orthogonal to the first slot patterns, and the end parts are between the line patterns and the adjacent frame shaped recesses, and the end parts and the rectangular protruding parts have same top level, and the frame shaped recesses are recessed with respect to a part of the substrate between adjacent frame shaped recesses; and second slot patterns recessed in the substrate in the first area and only surrounding edges of the end parts, wherein the second slot patterns and the first slot patterns have same recessed level.

2. The integrated circuit according to claim 1, wherein the first area comprises a dense area, the second area comprises an isolated area, and the dense area is right next to the isolated area.

3. The integrated circuit according to claim 1, wherein the first slot pattern has a minimum size larger than a minimum size of the line patterns.

4. The integrated circuit according to claim 1, wherein the line patterns comprise gate patterns, fin patterns, spacer patterns or mask patterns.

5. The integrated circuit according to claim 1, wherein the rectangular protruding part has a minimum size larger than a minimum size of the line pattern, and the minimum size is with respect to a width of a line of the line patterns and a width of the rectangular protruding part, respectively.

* * * * *